United States Patent
Kong et al.

(10) Patent No.: US 7,668,015 B2
(45) Date of Patent: Feb. 23, 2010

(54) NONVOLATILE MEMORY DEVICES CAPABLE OF REDUCING DATA PROGRAMMING TIME AND METHODS OF DRIVING THE SAME

(75) Inventors: Jae-phil Kong, Hwaseong-si (KR); Heung-soo Lim, Yongin-si (KR); Jae-yong Jeong, Yongin-si (KR); Chi-weon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 12/005,366

(22) Filed: Dec. 27, 2007

(65) Prior Publication Data

US 2008/0192540 A1    Aug. 14, 2008

(30) Foreign Application Priority Data

Feb. 8, 2007    (KR) ...................... 10-2007-0013338

(51) Int. Cl.
*G11C 16/04* (2006.01)
(52) U.S. Cl. ................................ 365/185.19
(58) Field of Classification Search ............ 365/185.19, 365/185.28, 185.18
See application file for complete search history.

(56) References Cited

U.S. PATENT DOCUMENTS

| 7,161,839 B2 * | 1/2007 | Im ........................ 365/185.28 |
| 7,379,372 B2 * | 5/2008 | Jeong ........................ 365/226 |
| 7,417,896 B2 * | 8/2008 | Cho et al. ............. 365/185.18 |
| 2004/0255212 A1 * | 12/2004 | Cullen et al. ................. 714/726 |
| 2006/0077720 A1 * | 4/2006 | Im ........................ 365/185.28 |

FOREIGN PATENT DOCUMENTS

| JP | 11-176178 | 7/1999 |
| KR | 1020060108430 A | 10/2006 |

* cited by examiner

*Primary Examiner*—Connie C Yoha
(74) *Attorney, Agent, or Firm*—Harness, Dickey & Pierce, P.L.C.

(57) ABSTRACT

In a method of driving a nonvolatile memory device a first data state is determined from among the plurality of data states. The number of simultaneously programmed bits is set according to the determined first data state and a scanning operation is performed on data input from an external device to search data bits to be programmed. The searched data bits are programmed in response to the number of simultaneously programmed bits. The number of simultaneously programmed bits corresponding to the first data state is different from a number of simultaneously programmed bits corresponding to at least a second of the plurality of data states.

22 Claims, 6 Drawing Sheets

$\Delta V_0 \gg \Delta V_1$

| DATA STATE | STEP VOLTAGE DIFFERENCE (V) | CELL CURRENT (μA) | NUMBER OF SIMULTANEOUSLY PROGRAMMED BITS (EA) |
|---|---|---|---|
| 10 | a | $I_{10}$ | L |
| 01 | 2a | $I_{01}$ | M |
| 00 | 30a | $I_{00}$ | N |

• NUMBER OF SIMULTANEOUSLY PROGRAMMED CELLS : L. M ≥ N

NONVOLATILE MEMORY DEVICES CAPABLE OF REDUCING DATA PROGRAMMING TIME AND METHODS OF DRIVING THE SAME

PRIORITY STATEMENT

This non-provisional U.S. patent application claims priority under 35 U.S.C. §119 to Korean Patent Application No. 10-2007-0013338, filed on Feb. 8, 2007, in the Korean Intellectual Property Office, the entire contents of which is incorporated herein in its entirety by reference.

BACKGROUND

Description of the Related Art

A nonvolatile flash memory capable of electrically programming and erasing data may consume less power than a storage media based on a magnetic disk memory, but may have access times as fast as hard disks. Conventional flash memory may be NOR type memory or NAND type memory according to a connection state of cells and bit lines. Conventional NOR type flash memory may be constructed such that at least two cell transistors are connected in parallel with a single bit line. Data may be stored using channel hot electron effect and data may be erased using Fowler-Nordheim (F-N) tunneling. Conventional NAND type flash memory may be constructed such that at least two cell transistors are connected to a single bit line in series, and may store and erase data using F-N tunneling. Conventional NOR type flash memory may be operated at a higher speed, but may not be suitable for relatively high integration because of relatively high power consumption. Conventional NAND type flash memory may be more highly integrated because it requires a relatively small cell current.

FIG. 1A is a circuit diagram illustrating memory cells included in a conventional NAND type flash memory. Referring to FIG. 1, the conventional NAND type flash memory may include a plurality of wordlines WL11, WL12, WL13 and WL14 and a plurality of memory cells M11, M12, M13 and M14. The plurality of memory cells M11, M12, M13 and M4 and select transistors ST1 and ST2 may constitute a string and may be connected in series between a bit line and a ground voltage VSS. The conventional NAND type flash memory may program all the memory cells connected to a single wordline through a single programming operation using a relatively small cell current.

FIG. 1B is a circuit diagram illustrating memory cells included in a conventional NOR type flash memory. Referring to FIG. 1B, a plurality of memory cells M21 through M26 may be connected between bit lines BL1 and BL2 and a source line CSL. The conventional NOR type flash memory may program a number of memory cells through a single programming operation using a relatively large current for a programming operation.

A multi-level cell (MLC) technique capable of storing at least two bits in a single memory cell may be used in conventional flash memory devices. For example, when 2-bit data is stored in a single memory cell, the memory cell may require four threshold voltage states. The data stored in a single memory cell may have one of '11', '10', '01' and '00' states according to combinations of two bits.

FIG. 2 illustrates a conventional threshold voltage distribution of a multi-level cell when 2-bit data is stored in a single memory cell. As illustrated in FIG. 2, the conventional multi-level cell has one of '11', '10', '01' and '00' in response to a threshold voltage programmed therein. In this example, '11' may correspond to an erased state, whereas '10', '01' and '00' may correspond to a programmed state.

Because a conventional memory cell has the highest threshold voltage when programmed as '00', the memory cell may be programmed only with a voltage higher than the threshold voltage corresponding to '01' state by a given level. Accordingly, the threshold voltage corresponding to the '00' state may be distributed in a relatively wide range. However, the '01' and '10' states may have an intermediate threshold voltage, and thus, the threshold voltage corresponding thereto must be distributed in a sufficiently narrow range.

In conventional incremental step pulse programming (ISPP) method for programming a conventional flash memory cell, as a step voltage difference increases, the distribution of a threshold voltage may increase. Accordingly, step voltages need to be applied to a memory cell with a sufficiently small voltage difference when '01' and '10' are programmed. As discussed above, '01' and '10' may require a relatively narrow threshold voltage distribution. However, when the voltage difference is too small, a relatively large number of steps may be required to reach a target voltage, which may increase a programming time. Accordingly, the voltage difference may be appropriately selected considering programming time and width of the threshold voltage distribution. When '00' is programmed, the voltage difference may increase to reduce programming time.

FIG. 3 illustrates a wordline voltage variation in a conventional ISPP operation. Referring to FIG. 3, the upper graph illustrates a wordline voltage variation when programming '00' and the lower graph illustrates a wordline voltage variation when programming '01' or '10'. As illustrated in FIG. 3, a step voltage difference $\Delta V0$ when programming '00' may be larger than a step voltage difference $\Delta V1$ when programming '01' and '10'.

Current flows through a drain of a memory cell when programming the memory cell. In this example, current may increase as the difference between the threshold voltage of the memory cell and a voltage applied to a gate of the memory cell increases. For example, a relatively large step voltage may be applied to the gate of the memory cell when programming '00', and thus, a relatively large current may flow through the memory cell.

When a memory cell is programmed according to a conventional bit scan method, a given number of bits of data to be programmed (e.g., '10', '01' and '00') among input data may be searched, and the searched data bits may be programmed simultaneously. The number of bits programmed simultaneously by a one-time programming operation may be limited to a given number of bits if the quantity of current provided by a pump circuit is restricted.

In a conventional flash memory, however, '01' or '10' may be programmed by the same number of bits as the number of bits by which '00' is programmed although the operation of programming '01' or '10' may require a relatively small current. For example, when N '00's are simultaneously programmed within the capacity of a pump circuit, N '10's, or '10's may also be simultaneously programmed. Accordingly, when '01' or '10' is programmed, the programming operation may be carried out for a number of bits smaller than the number of bits that may be programmed simultaneously, and thus, a programming time may increase.

SUMMARY

Example embodiments relate to nonvolatile memory devices and methods of driving the same, for example, to nonvolatile memory devices capable of reducing data programming times by varying the number of simultaneously programmed bits and methods of driving nonvolatile memory devices.

Example embodiments provide nonvolatile memory devices capable of reducing time required for a programming operation by varying the number of simultaneously programmed data bits in response to a programmed data state and methods of driving the same.

At least one example embodiment provides a method of driving a nonvolatile memory device having multi-level cells and performing a programming operation for each of a plurality of data states. According to at least this example embodiment, a data state to be programmed may be determined from among a plurality of data states. The number of simultaneously programmed bits may be set according to the determination result. A scanning operation may be performed on data input from an external device to search data to be programmed. and The searched data may be programmed in response to the number of simultaneously programmed bits. The number of simultaneously programmed bits corresponding to at least one of the plurality of data states may be different from the numbers of simultaneously programmed bits corresponding to the other data states.

According to at least some example embodiments, the method may employ an incremental step pulse programming (ISPP) method that applies different step voltages to wordlines in response to data states to be programmed. The plurality of data states may include a first state programmed by a step voltage having a relatively large voltage difference and a second state programmed by a step voltage having a relatively small voltage difference. The number of simultaneously programmed bits corresponding to the first state may be different from the number of simultaneously programmed bits corresponding to the second state.

According to at least some example embodiments, the number of simultaneously programmed bits set in response to the second state, may be larger than the number of simultaneously programmed bits set in response to the first state. The first state may have the highest threshold voltage and the second state may have an intermediate threshold voltage. The plurality of data states may include four states representing 2-bit data, '00' may correspond to the first state, '01' and '10' may correspond to the second state. The number of simultaneously programmed bits may be set according to the determination result and may correspond to the maximum number of bits that may be simultaneously programmed within the capacity of a pump circuit.

According to at least some example embodiments, the nonvolatile memory device may be an NOR type flash memory.

At least one other example embodiment provides a method of driving a nonvolatile memory device having multi-level cells and performing a programming operation for each of a plurality of data states. According to at least this example embodiment, data input from an external device may be stored in an input/output buffer. A data state to be programmed may be determined and a step voltage corresponding to the data state may be applied. The number of simultaneously programmed bits may be set based on a current required for a programming operation. A programming operation may be performed on the input data for the respective data states in response to the numbers of simultaneously programmed bits.

According to at least some example embodiments, the setting of the number of simultaneously programmed bits may increase the number of simultaneously programmed bits when a relatively small current flows to each cell when a programming operation is performed. The setting of the number of simultaneously programmed bits may decrease when a relatively large current flows to each cell during a programming operation.

At least one other example embodiment provides a nonvolatile memory device performing a programming operation for each of a plurality of data states. According to at least this example embodiment, a memory cell array may include multi-level cells. A state determination circuit or unit may provide information about a data state to be programmed from among the plurality of data states. A data scanning circuit or unit may latch data input from an external device, and search data to be programmed in the memory cell array through a scanning operation in response to the number of simultaneously performed bits. The data scanning circuit may output the searched data. A control logic may control the programming operation to be executed for the respective data states in response to the information provided by the state determination circuit. The number of simultaneously programmed bits may be varied according to the data state to be programmed.

According to at least some example embodiments, the nonvolatile memory device may further include a bit controller configured to control the number of simultaneously programmed bits in response to the information about the data state to be programmed.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1A:
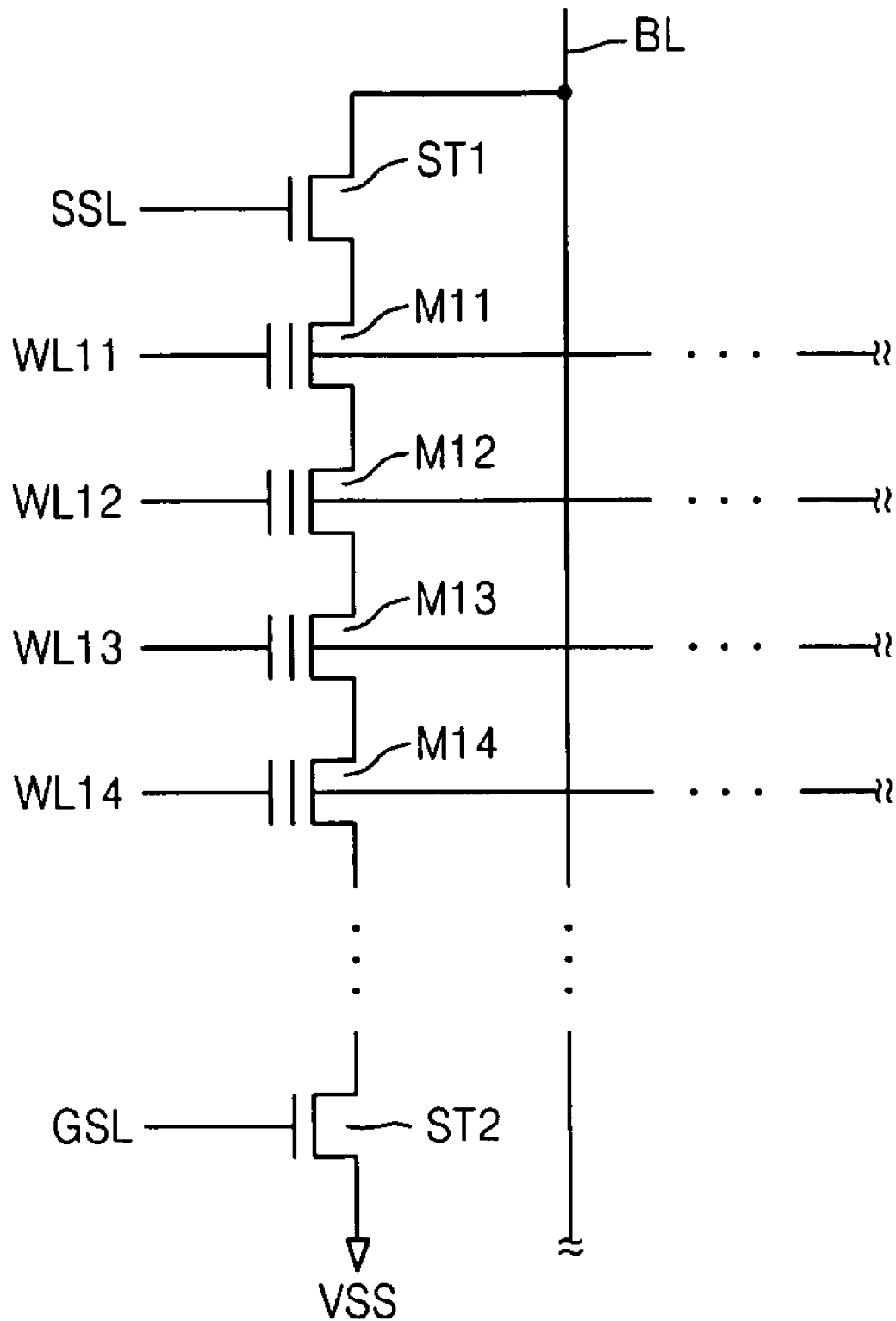
FIG. 1A is a circuit diagram illustrating memory cells included in a conventional NAND type flash memory.
Figure 1B:
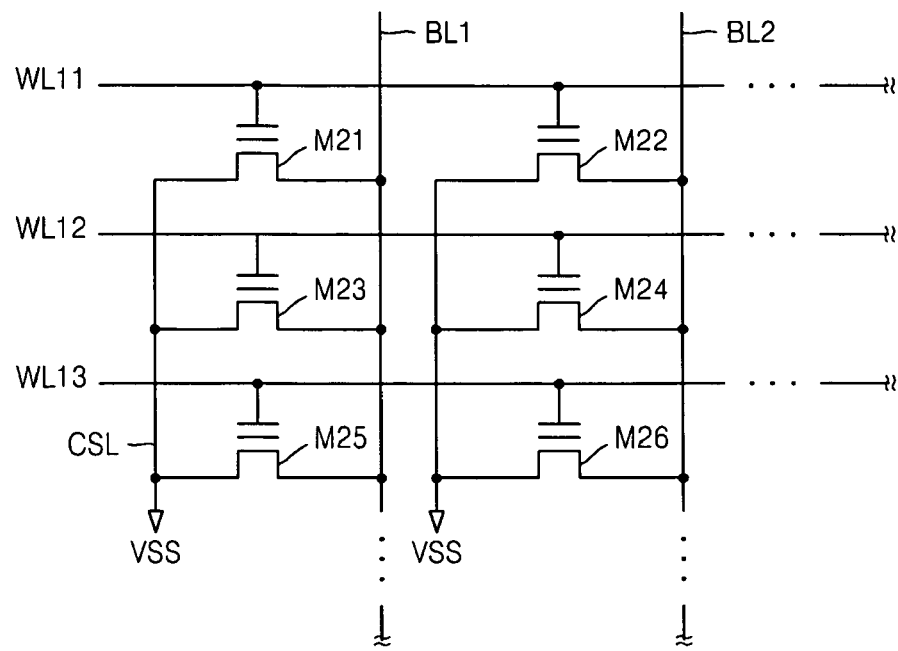
FIG. 1B is a circuit diagram illustrating memory cells included in a conventional NOR type flash memory.
Figure 2:
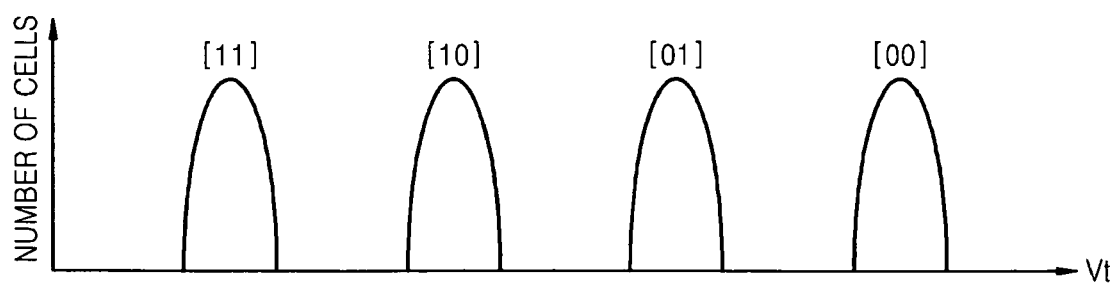
FIG. 2 illustrates a threshold voltage distribution of a conventional multi-level cell.
Figure 3:
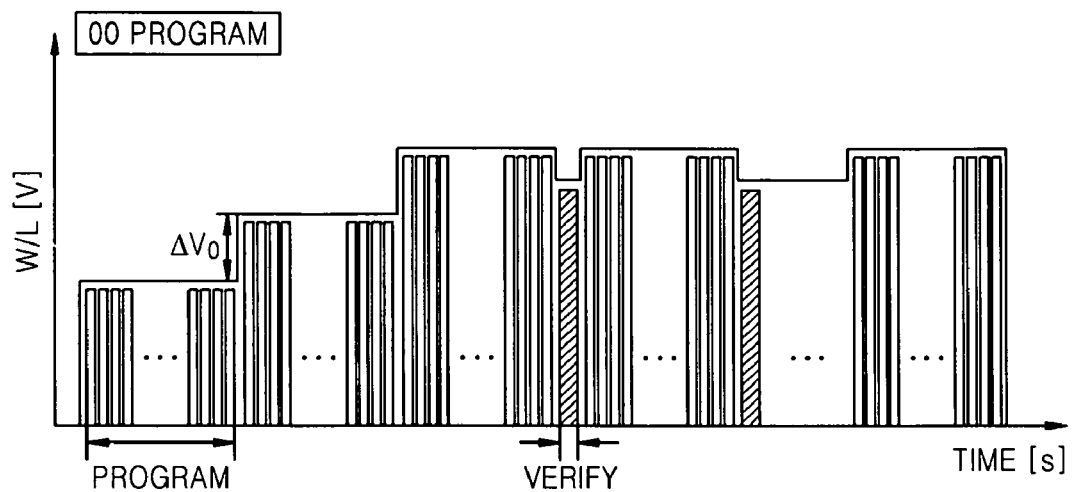
FIG. 3 illustrates a wordline voltage variation in an ISPP operation.
Figure 3:
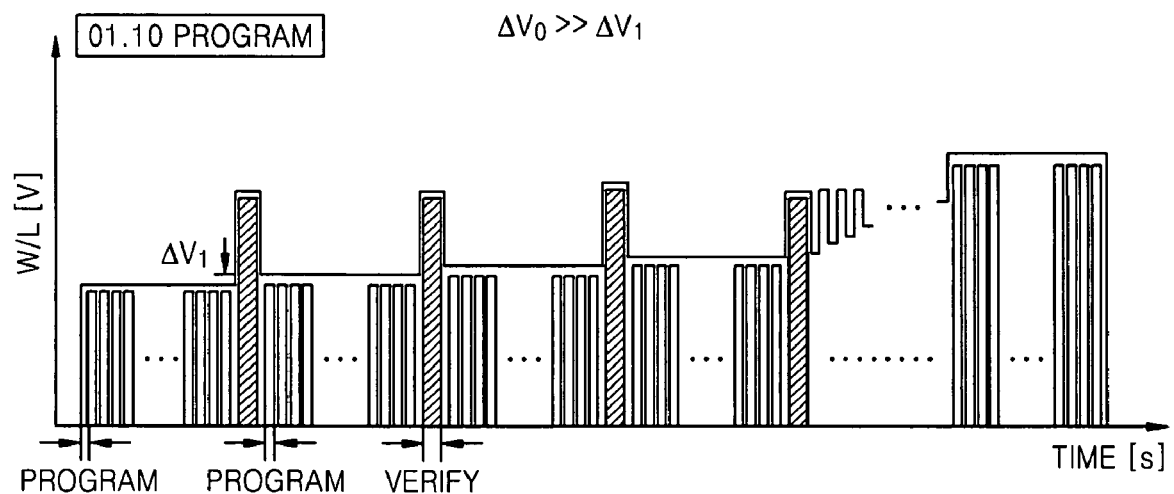

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
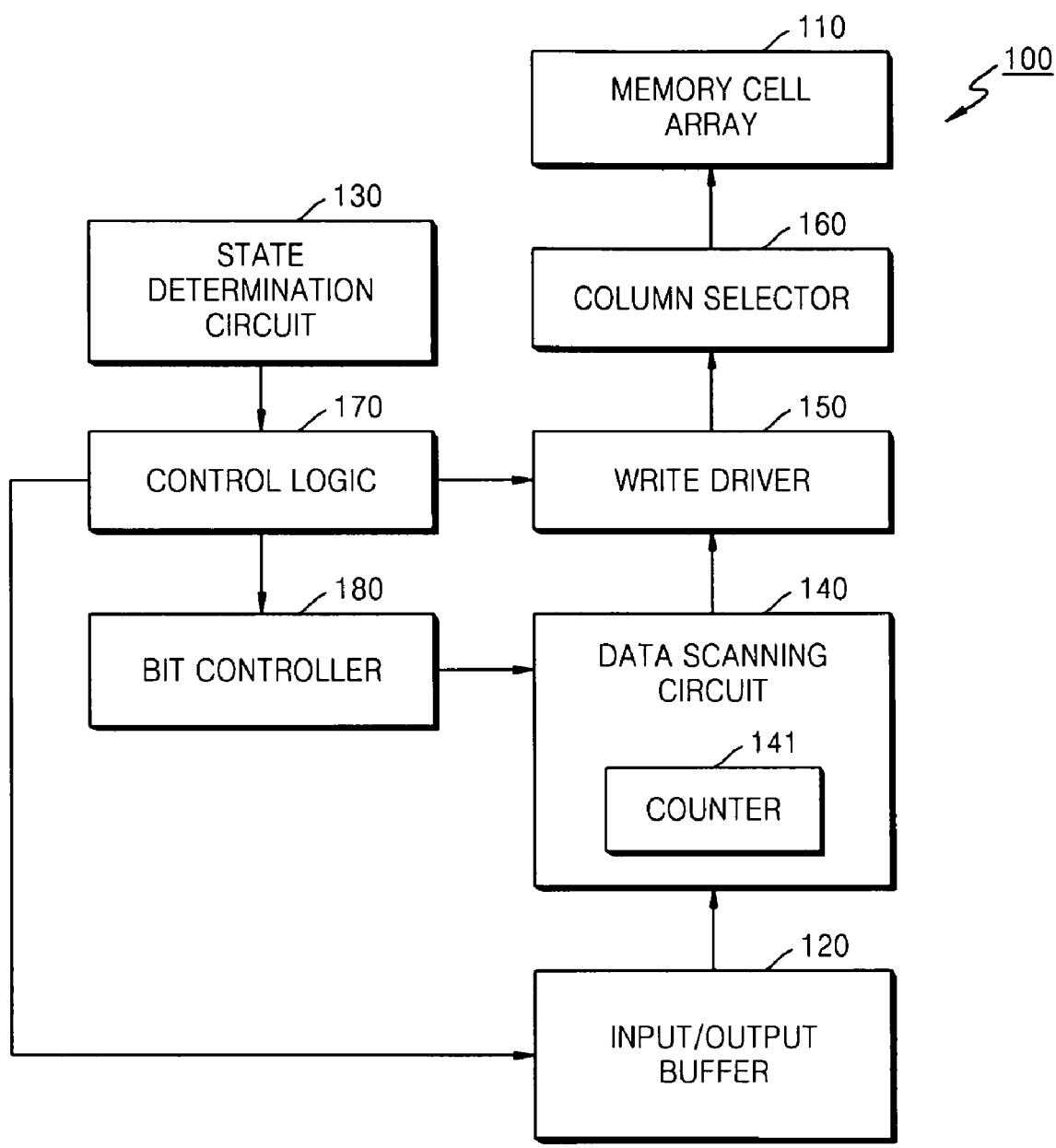
FIG. 4 is a block diagram of a nonvolatile memory device according to an example embodiment.

FIG. 4 is a block diagram of a nonvolatile memory device according to an example embodiment. Referring to FIG. 4, the nonvolatile memory device 100 may include a memory cell array 110 having a plurality of memory cells and peripheral circuits for driving the memory cell array 110.

The nonvolatile memory device 100 may be a NOR type flash memory. The NOR type flash memory may apply step voltages to wordlines according to an incremental step pulse programming (ISPP) method to program memory cells. The NOR type flash memory that programs memory cells according to an ISPP method may use a bit scan method to increase a programming speed. The bit scan method may search for a certain number of bits (e.g., '00', '01' and '10' in a multi-level cell) of data to actually be programmed and may simultaneously program the searched data bits. When the number of bits simultaneously programmed according to the bit scan method increases, programming time may be reduced. The maximum number of bits that may be simultaneously programmed may be set within the capacity of a pump circuit (not shown).

The memory cell array 110 may include multi-level cells such that at least two bits may be stored in a single memory cell. When each multi-level cell stores two bits, each multi-level cell may include a plurality of (e.g., four) threshold voltage states. Two-bit data stored in each multi-level cell includes '11', '10', '01' and '00', respectively, corresponding to the threshold voltages.

When a memory cell storing multiple bits (e.g., two bits) is programmed according to the ISPP method, different step voltages corresponding to the respective data states may be applied to wordlines and data searching and programming operations may be performed according to the respective data states.

Because the threshold voltage representing data '00' has the highest level, the threshold voltage may be more widely distributed when the data '00' is programmed. Accordingly, a voltage difference of a step voltage applied to a corresponding wordline may increase when the data '00' is programmed.

The threshold voltages representing data '01' and '10' may have an intermediate level among the four levels, and thus, may be distributed in a relatively narrow range. Accordingly, a voltage difference of a step voltage applied to the corresponding wordline may be decreased when data '01' and '10' are programmed.

The peripheral circuits may include an input/output buffer 120, a state determination circuit or unit 130, a data scanning circuit or unit 140, a write driver 150, and a column selector 160. The nonvolatile memory device 100 may further include a control logic 170 and a bit controller 180. The control logic 170 may control the peripheral circuits and the bit controller 180 may control the number of simultaneously programmed bits. The number of simultaneously programmed bits may be set in the data scanning circuit 140.

The input/output buffer 120 may store data input from an external device and provide the stored data to the data scanning circuit 140. The data scanning circuit 140 may include a scan latch (not shown) for temporarily storing the input data. The data scanning circuit 140 may perform a scanning operation on the received data to search data to actually be programmed and may provide searched data to the memory cell array 110.

When a multi-level cell storing 2-bit data is programmed, for example, data '11', '10', '01' and '00' may be programmed according to their states. The data '11' may not be programmed because it corresponds to an erased state and the data '10', '01' and '00' may be sequentially programmed. The state determination circuit 130 may provide information about a currently programmed data state.

The control logic 170 may control the circuits included in the memory device 100. For example, the control logic 170 may control the circuits in the memory device 100 to perform a programming operation according to respective data states based on the information provided by the state determination circuit 130. When '10' is programmed, the data scanning circuit 140 may search the input data for '10'. The data scanning circuit 140 may have information regarding the number of simultaneously programmed bits. The number of simultaneously programmed bits may be set to a given value. The data scanning circuit 140 may include a counter 141. The counter 141 may count the number of searched data bits. When the counted number of searched data reaches the number of simultaneously programmed bits, the data scanning circuit 140 may provide the searched data to the write driver 150.

The write driver 150 may perform a programming operation on the memory cell array 110 using the data provided by the data scanning circuit 130 and address information provided through a given circuit path. The column selector 160 may select a bit line (not shown) of the memory cell array 110 in response to the address information.

In the memory device 100, step voltages generated by a step voltage generator (not shown) may be applied to wordlines. As described above, a step voltage difference may increase when '00' is programmed, but may decrease when '01' and/or '10' are programmed.

According to example embodiments, a programming operation may be performed in response to each data state, and thus, current flowing through the bit line of a memory cell may vary. In one example, the number of simultaneously programmed bits may be restricted by the capacity of a pump circuit (not shown). In example embodiments, the number of simultaneously programmed bits may vary according to data state, and thus, the pump circuit may be more efficiently used and a programming speed may improve.

In one example embodiment, the memory device 100 may further include bit controller 180. The bit controller 180 may control a value representing the number of simultaneously programmed bits set in the data scanning circuit 140 in response to the currently programmed data state. For example, the bit controller 180 may control the value representing the number of simultaneously programmed bits according to the information provided by the state determination circuit 130 and may operate based on the control logic 170 controlling the circuits included in the memory device 100.

As described above, the number of simultaneously programmed bits set in the data scanning circuit 140 may vary according to the currently programmed data state. For example, when '01' and '10' are programmed in a memory cell, the current flowing through the bit line of the memory cell may decrease because a step voltage having a small voltage difference may be applied to a wordline corresponding to the memory cell. The bit controller 180 may set the number of simultaneously programmed bits to a relatively large value when '01' and/or '10' are programmed. Accordingly, a relatively large number of data bits may be simultaneously programmed within the capacity of the pump circuit.

When '00' is programmed in a memory cell, the current flowing through the bit line of the memory cell may increase because a step voltage having a large voltage difference may be applied to the wordline corresponding to the memory cell. The bit controller 180 may set the number of simultaneously programmed bits to a relatively small value when programming '00' to suppress (e.g., prevent) the current flowing through the bit line of the memory cell from exceeding the capacity of the pump circuit.

The number of simultaneously programmed bits may be set to the maximum number of bits that may be simultaneously programmed within the range of the capacity of the pump circuit in response to each data state.

Figures 5, 6:
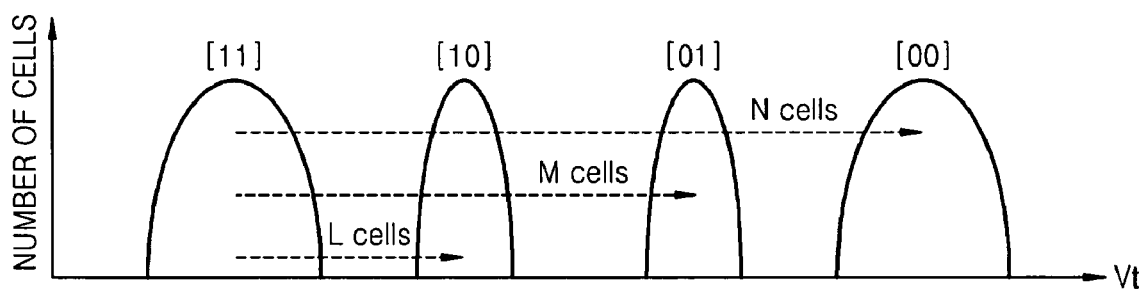
FIG. 5 illustrates the number of data bits simultaneously programmed, which is set based on a data state according to an example embodiment.
FIG. 6 illustrates the relationship between a threshold voltage distribution of a multi-level cell and the number of simultaneously programmed data bits according to an example embodiment.

FIG. 5 is a table showing an example number of simultaneously programmed bits, which may be set in response to a programmed data state. In FIG. 5, the relationship among a data states programmed in a multi-level cell, a step voltage difference, a cell current and the number of simultaneously programmed bits is illustrated.

When '10' is programmed, a step voltage having a relatively small voltage difference (e.g., a Volts) may be applied to a memory cell and a current $I_{10}$ corresponding to the step voltage may flow to a bit line corresponding to the memory cell. The number of simultaneously programmed bits may be set to L according to the cell current $I_{10}$ and capacity of a pump circuit. The cell current $I_{10}$ may be relatively small, and thus, the number of simultaneously programmed bits may increase.

When '01' is programmed, a step voltage having a relatively small voltage difference may be applied to the memory cell to distribute the threshold voltage corresponding to '01' in a relatively narrow range. For example, a step voltage equal or substantially equal to the step voltage used when '10' is programmed or a step voltage higher (e.g., slightly higher) than the step voltage may be applied to the memory cell. As illustrated in FIG. 5, a step voltage of 2a Volts may be applied and a current $I_{01}$ may flow in response to the step voltage. The current $I_{01}$ may be larger (e.g., slightly larger) than the current $I_{10}$. The number of simultaneously programmed bits may be set to M according to the cell current $I_{01}$ and the capacity of the pump circuit. In this example, M may be set to a value smaller than L according to the capacity of the pump circuit.

When '00' is programmed, a step voltage having a relatively large voltage difference (e.g., 30a Volts) may be applied to a memory cell. As a result, a current $I_{00}$ flowing to a bit line corresponding to the memory cell may increase. The number of simultaneously programmed bits may be set to N according to the cell current $I_{00}$ and the capacity of the pump circuit. The number N may be smaller than L and M. According to example embodiments, N, L and M may be natural numbers.

FIG. 6 illustrates an example relationship between a threshold voltage distribution of multi-level cells and the number of simultaneously programmed data bits according to an example embodiment. The multi-level cells in an erased state (e.g., data state '11') may be programmed to data state '10', '01' and '00'. As described in FIG. 6, the number of simultaneously programmed bits corresponding to '10' may be set to L, the number of simultaneously programmed bits corresponding to '01' may be set to M and the number of simultaneously programmed bits corresponding to '00' may be set to N.

As described above, the numbers of simultaneously programmed bits, L, M and N corresponding to respective programmed data states may be set in response to step voltage differences provided for respective data states. For example, when the step voltage applied when '10' is programmed has the same or substantially the same voltage difference as that of the step voltage applied when '01' is programmed, L and M may be set to the same or substantially the same value. When the voltage difference of the step voltage applied when '00' is programmed is larger than that of the step voltage applied when '10' and '01 are programmed, N may be smaller than L and M.

Figure 7:
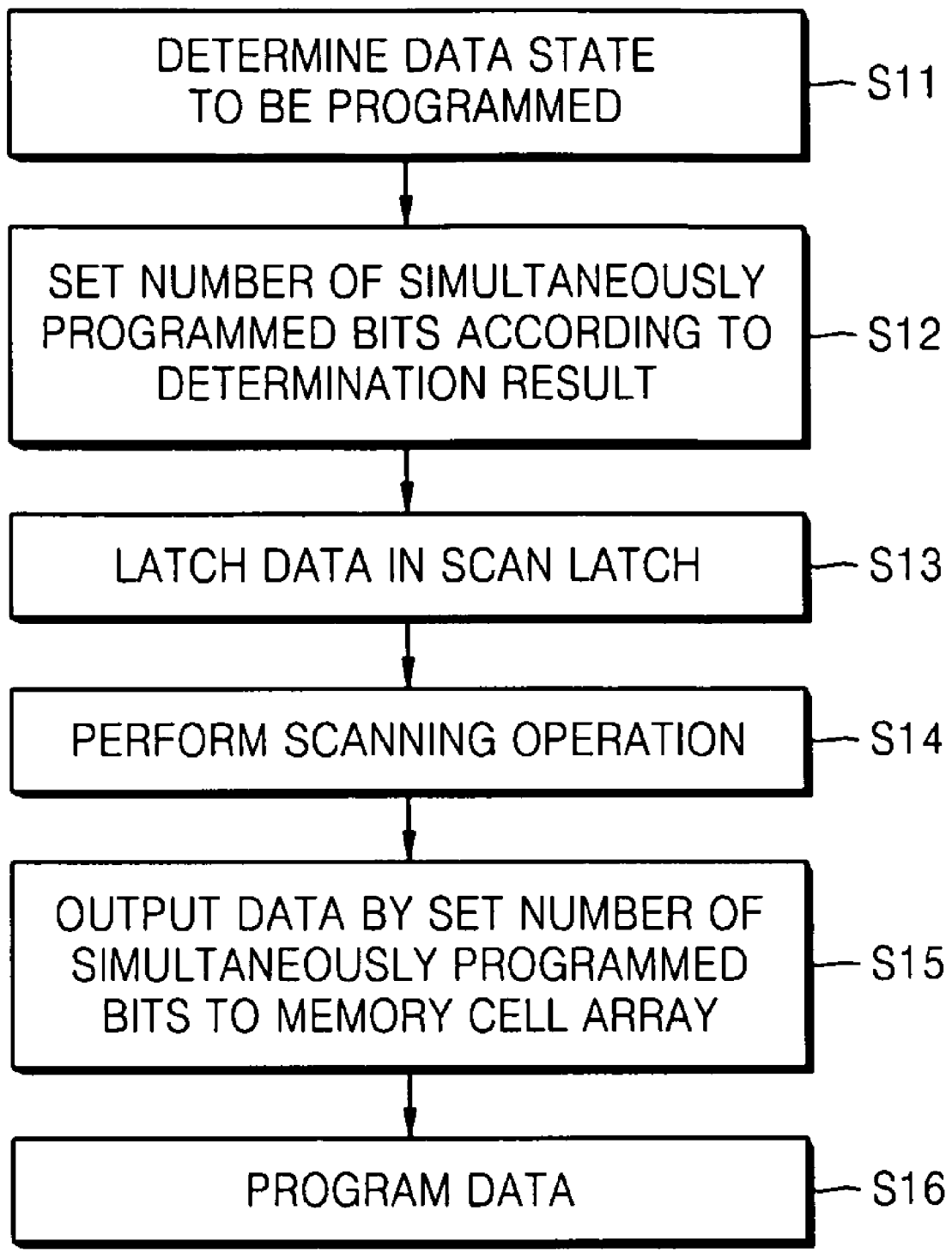
FIG. 7 is a flow chart of a method of driving a nonvolatile memory device according to an example embodiment.

FIG. 7 is a flow chart illustrating a method of driving a nonvolatile memory device according to an example embodiment.

Referring to FIG. 7, when a nonvolatile memory device performs a programming operation for each data state, the data state currently being programmed may be determined at S11. Different step voltages corresponding to respective data states may be applied to the memory device in the ISPP method, and a current flowing to a bit line of a memory cell may vary according to data state.

At S12, the number of simultaneously programmed bits may be set according to the determination result according to the capacity of a pump circuit included in the nonvolatile memory device. If a relatively small current flows to the bit line of the memory cell when the determined data state is programmed, the number of simultaneously programmed bits may be set to a relatively large value. When a relatively large current flows to the bit line of the memory cell, the number of simultaneously programmed bits may be set to a relatively small value.

At S13, data input from an external device may be latched in a scan latch included in the memory device in order to perform a scanning operation on the data. The latched data may be scanned at S14. Data bits to be programmed may be searched through the scanning operation and when the number of searched data bits reaches the number of simultaneously programmed bits, determined at S12, the searched data bits may be output to a memory cell array of the memory device at S15. The data bits provided to the memory cell array may be programmed at S16.

The aforementioned example method may be performed for each data state to be programmed (e.g., '10', '01' and '00' when a multi-level cell storing 2-bit data is programmed), and the number of simultaneously programmed bits corresponding to one of a plurality of data states, may be different from the numbers of simultaneously programmed bits corresponding to other data states. Accordingly, the number of simultaneously programmed bits may be set in response to a corresponding data state according to the current flowing to the bit line of the memory cell storing the data state and the capacity of the pump circuit. As a result, the pump circuit may be more efficiently used and/or the programming speed may improve.

Nonvolatile memory devices according to example embodiments may set the number of simultaneously programmed in response to data states to be programmed. As a result, pump circuits may be more efficiently used and/or the programming speed may improve.

While example embodiments have been particularly shown and described with reference to the drawings thereof, it will be understood by those of ordinary skill in the art that various changes in form and details may be made therein without departing from the spirit and scope of the present invention as defined by the following claims.

What is claimed is:

1. A method of driving a nonvolatile memory device, the method comprising:
    determining a first data state among a plurality of data states;
    setting a number of simultaneously programmed bits according to the first data state;
    performing a scanning operation on data input from an external device to search data to be programmed; and
    programming the searched data in response to the set number of simultaneously programmed bits; wherein
        the set number of simultaneously programmed bits is different from a set number of simultaneously programmed bits corresponding to at least a second data state among the plurality of data states, and wherein
        the set number of simultaneously programmed bits is a relatively large value when a first current flows to each memory cell of the nonvolatile memory device and the set number of simultaneously programmed bits is a relatively small value when a second current flows to each memory cell of the nonvolatile memory device, the first current being less than the second current.

2. The method of claim 1, wherein an incremental step pulse programming (ISPP) method that applies different step voltages to wordlines in response to data states to be programmed is used.

3. The method of claim 2, wherein the plurality of data states include a first state programmed by a step voltage having a first voltage difference and a second state programmed by a step voltage having a second voltage difference, the first voltage difference being greater than the second voltage difference, and the number of simultaneously programmed bits corresponding to the first state is different from the number of simultaneously programmed bits corresponding to the second state.

4. The method of claim 3, wherein the number of simultaneously programmed bits corresponding to the second state is larger than the number of simultaneously programmed bits corresponding to the first state.

5. The method of claim 3, wherein the first state has a maximum threshold voltage and the second state has an intermediate threshold voltage, the intermediate threshold voltage being between the maximum threshold voltage and a minimum threshold voltage.

6. The method of claim 5, wherein the plurality of data states include four states representing 2-bit data, wherein
    '00' corresponds to the first state, and
    at least one of '01' and '10' correspond to the second state.

7. The method of claim 1, wherein the number of simultaneously programmed bits set according to the first data state corresponds to the maximum number of simultaneously programmed bits within the capacity of a pump circuit.

8. The method of claim 1, wherein the nonvolatile memory device is an NOR type flash memory.

9. A method of driving a nonvolatile memory device, the method comprising:
    storing data input from an external device;
    determining a first data state among a plurality of data states to be programmed;
    applying a step voltage corresponding to the first data state;
    setting a number of simultaneously programmed bits corresponding to each of the plurality of data states based on a current required for a programming operation; and
    performing a programming operation on the input data for each of the plurality of data states in response to a corresponding set number of simultaneously programmed bits, wherein,
        when performing the programming operation, the number of simultaneously programmed bits is a relatively large value when a first current flows to each memory cell and the number of simultaneously programmed bits is a relatively small value when a second current flows to each memory cell, the first current being less than the second current.

10. The method of claim 9, wherein the plurality of data states include a first state programmed using a first step voltage and a second state programmed using a second step voltage, and
    wherein the number of simultaneously programmed bits corresponding to the first state is different from the number of simultaneously programmed bits corresponding to the second state when a voltage difference of the first step voltage is different from that of the second step voltage.

11. The method of claim 10, wherein when the voltage difference of the second step voltage is smaller than that of the first step voltage, the number of simultaneously programmed bits corresponding to the second state is larger than the number of simultaneously programmed bits corresponding to the first state.

12. The method of claim 11, wherein the plurality of data states include four states representing 2-bit data, '00' corresponds to the first state, and at least one of '01' and '10' correspond to the second state.

13. The method of claim 9, wherein the set number of simultaneously programmed bits corresponding to each of the plurality of data states corresponds to a maximum number of simultaneously programmed bits within the capacity of a pump circuit.

14. The method of claim 9, wherein the nonvolatile memory device is an NOR type flash memory.

15. A nonvolatile memory device comprising:

a memory cell array;

a state determination circuit configured to provide information associated with a first data state among the plurality of data states;

a data scanning circuit configured to latch data input from an external device, search data to be programmed in the memory cell array through a scanning operation in response to a number of simultaneously programmed bits and output the searched data; and a control logic configured to control the programming operation to be executed for the respective data states in response to information provided by the state determination circuit; wherein the number of simultaneously programmed bits set in the data scanning unit varies according to the data state to be programmed; and wherein the set number of simultaneously programmed bits is a relatively large value when a first current flows to a memory cell of the memory cell array and the set number of simultaneously programmed bits is a relatively small value when a second current flows to a memory cell of the memory cell array, the first current being less than the second current.

16. The nonvolatile memory device of claim 15, further including, a bit controller configured to control the number of simultaneously programmed bits set in the data scanning circuit in response to the information about the data state to be programmed.

17. The nonvolatile memory device of claim 15, wherein an incremental step pulse programming (ISPP) method in which different step voltages are applied to wordlines in response to data states to be programmed is used.

18. The nonvolatile memory device of claim 17, wherein the plurality of data states include a first state programmed by a step voltage having a first voltage difference and a second state programmed by a step voltage having a second voltage difference, and wherein the number of simultaneously programmed bits set when data of the first state is programmed is different from the number of simultaneously programmed bits set when data of the second state is programmed, the first voltage different being greater than the second voltage difference.

19. The nonvolatile memory device of claim 18, wherein a number of simultaneously programmed bits set in response to the second state is larger than a number of simultaneously programmed bits set in response to the first state.

20. The nonvolatile memory device of claim 19, wherein the plurality of data states include four states representing 2-bit data, '00' corresponding to the first state, and at least one of '01' and '10' corresponding to the second state.

21. The nonvolatile memory device of claim 15, wherein the number of simultaneously programmed bits set according to the first data state corresponds to the maximum number of simultaneously programmed bits.

22. The nonvolatile memory device of claim 15, wherein the nonvolatile memory device is an NOR type flash memory.

* * * * *